(12) United States Patent
Dempster et al.

(10) Patent No.: US 7,622,911 B2
(45) Date of Patent: Nov. 24, 2009

(54) ELECTRICAL POWER METERING DEVICE AND METHOD OF OPERATION THEREOF

(75) Inventors: Philip Tinsley Dempster, Concord, CA (US); Warren Beacom, Scarborough (CA); Richard Qinxue Liang, Scarborough (CA)

(73) Assignee: Intellimeter Canada, Inc. (CA)

( * ) Notice: Subject to any disclaimer, the term of this patent is extended or adjusted under 35 U.S.C. 154(b) by 0 days.

(21) Appl. No.: 11/962,644

(22) Filed: Dec. 21, 2007

(65) Prior Publication Data
US 2009/0102456 A1  Apr. 23, 2009

Related U.S. Application Data

(60) Provisional application No. 60/981,019, filed on Oct. 18, 2007.

(51) Int. Cl.
*G01R 7/00* (2006.01)
*G01R 21/00* (2006.01)
*G08B 23/00* (2006.01)

(52) U.S. Cl. .............. 324/142; 702/61; 340/870.02

(58) Field of Classification Search .............. None
See application file for complete search history.

(56) References Cited

U.S. PATENT DOCUMENTS

| 6,735,535 | B1 | 5/2004 | Kagan et al. | |
|---|---|---|---|---|
| 6,882,137 | B1 * | 4/2005 | Voisine | 324/76.11 |
| 7,112,949 | B2 * | 9/2006 | Voisine | 324/76.11 |
| 7,359,809 | B2 * | 4/2008 | Bruno | 324/142 |
| 7,493,222 | B2 * | 2/2009 | Bruno | 324/142 |
| 2005/0137813 | A1 * | 6/2005 | Swarztrauber et al. | 702/62 |
| 2006/0085144 | A1 * | 4/2006 | Slota et al. | 702/57 |
| 2007/0069715 | A1 * | 3/2007 | Bruno | 324/76.11 |
| 2008/0036447 | A1 * | 2/2008 | Slater et al. | 324/105 |

\* cited by examiner

*Primary Examiner*—Jermele M Hollington
(74) *Attorney, Agent, or Firm*—Aka Chan LLP

(57) ABSTRACT

A metering device for metering energy delivered to customers over electrical wires from a power distribution cabinet. The metering device has a plurality of current transformers, each capable of receiving one of the electrical wires and connections for the line voltages which drive the wires. The current transformers are arranged for physical correspondence to the power outputs of the power distribution cabinet. Circuitry connected to the current transformers and line voltage connections meter the energy over the electrical wires.

31 Claims, 13 Drawing Sheets

US 7,622,911 B2

ELECTRICAL POWER METERING DEVICE AND METHOD OF OPERATION THEREOF

CROSS-REFERENCE TO RELATED APPLICATIONS

This patent application is claims the benefit of U.S. provisional patent application 60/981,019 filed Oct. 18, 2007, which is incorporated by reference along with all other references cited in this application.

BACKGROUND OF THE INVENTION

This invention relates to electrical power wires and, more particularly to, devices for metering electric power wires.

It should be noted in passing that in the metering of power and energy, the two terms are often used interchangeably. In strict terms, this is erroneous. The familiar "power" meter on a customer's premises actually measures the amount of energy consumed over a period of time. A customer is changed by the energy consumed. Power is the rate at which energy is being delivered to, and consumed by, the customer.

Current metering technology is bulky and the required wiring of the current transformers, which monitor the current carried by the wires to the customers, is confusing. A particular problem is the identification of all the load-carrying wires with the current transformer signal leads. Up to now, an electrician must identify the individual leads among a thicket of similar looking wires. This makes installation of power metering a complex and error-prone process. Such problems discourage the retrofitting of metering to sites where metering to individual consumers is not done but highly desirable. For example, many apartment buildings have only a single metering device for the entire building, though individual billing is highly desirable due to issues of environmental responsibility, legislative constraints and pressure to lower costs. However, the electrical wiring of such buildings is not conducive to retrofitting metering. Extensive rewiring is required with conventional metering, which makes the task in a finished building nearly impossible or extremely difficult.

To avoid or ameliorate the problems of conventional metering, the present invention provides for an electrical metering device at the power distribution cabinet. Power distribution cabinets are located near the end of electricity distribution networks to supply customers, such as homes and businesses, with electricity. Electrical wires from the power distribution cabinets provide the link from the electricity distribution networks to the customer's premises. The present invention allows for the monitoring the amount of energy supplied to each customer by an economical arrangement which is simple to install, easy to calibrate and is accurate. Rearrangements to supply power to customers are easily accommodated.

The present invention provides for such an improvement.

BRIEF SUMMARY OF THE INVENTION

One embodiment of the present invention provides for a metering device for a power distribution cabinet delivering power from power outputs through electrical wires to one or more customers. The metering device comprises a board having a plurality of holes, a hole for receiving one of the electrical wires therethrough; connections for different line voltages on the board; a plurality of current transformers on the board, each current transformer arranged around one of the plurality of holes so as to generate a output signal responsive to a current of an electrical wire through the hole, the current transformers and holes arranged for physical correspondence to the power outputs; and circuitry on the board connected to the current transformers and the voltage connections for metering energy from the power outputs through the electrical wires to one or more of the customers. The integration of the plurality of current transformers, the line voltage connections and the circuitry into the metering device simplifies installation, reduces installation time, and reduces the possibility of installation error of the metering device.

Another embodiment of the present invention provides for a method of operating a metering device for a power distribution cabinet which distributes power through a plurality of electrical wires, each wire driven by a line voltage, the metering device having a plurality of current transformers, each current transformer generating a current signal voltage responsive to a current of an electrical wire through the current transformer, and a plurality of connections for a plurality of different line voltages. The method comprises arranging the plurality of current transformers in physical correspondence to power outputs of the power distribution cabinet. The method further comprises mapping a current signal voltage of at least one of the current transformers to a line voltage driving an electrical wire associated with the current transformer; metering energy by product of the current signal voltage and the line voltage according to the mapping; and storing the mapping into nonvolatile memory. The method also comprises calibrating the metered energy by product of the current signal voltage and the line voltage according to the mapping.

Still another embodiment of the present invention provides for a method of operating a metering device for a power distribution cabinet which distributes power through a plurality of electrical wires, each wire driven by a line voltage, the metering device having a plurality of current transformers, each current transformer generating a current signal voltage responsive to a current of an electrical wire through the current transformer, and a plurality of connections for a plurality of different line voltages. The method comprises generating a calibration number from an energy reading of a reference metering device and a metered energy reading of each current transformer and corresponding electrical wire mapped to be driven by the same line voltage. This allows the metered energy to be rapidly calibrated. The method also comprises storing the mapping of each current transformer and corresponding electrical wire to be driven by the same line voltage in a nonvolatile memory.

Another embodiment of the present invention provides for a method of calibrating a metering device for a power distribution cabinet which distributes power through a plurality of electrical wires, each wire driven by a line voltage, the metering device having a plurality of current transformers, each current transformer generating a current signal voltage responsive to a current of an electrical wire through the current transformer, and a plurality of connections for a plurality of different line voltages. The method comprises generating a calibration number from an energy reading of a reference metering device and a metered energy reading of each current transformer and a line voltage. The method also comprises sequentially generating the calibration number for each current transformer and line voltage.

Another embodiment of the present invention provides for a device for metering energy delivered on electrical wires. The device comprises at least one current transformer arranged to generate a signal in response to current on an electrical wire; at least one voltage connection for a line voltage of the electrical wire; and circuitry connected to the current transformer and the voltage connection sampling the current transformer signal and the line voltage to measure instantaneous energy delivery over the electrical wire, the circuitry including an electronic computing device which acquires at least one internal pair of energy accumulation numbers, one number corresponding to internal energy accumulation by the metering device from the measured instantaneous energy delivery, another number corresponding to external measurement of energy by a reference metering device, and calculates a calibration number to create substantial equivalence between the pair of energy accumulation numbers by a comparison of the two numbers. This permits the metering device to calibrate measurement of the instantaneous energy delivery over the electrical wire.

Another embodiment of the present invention provides for a method of operating a metering device for a power distribution cabinet distributing power through a plurality of electrical wires, each wire driven by a line voltage, the metering device having a plurality of current transformers, each current transformer generating a current signal voltage responsive to a current of an electrical wire through the current transformer, and a plurality of connections for a plurality of different line voltages. The method comprises calibrating each metered energy reading of each current transformer with a number comprising a ratio of energy reading of a reference metering device to a metered energy reading of the current transformer and corresponding electrical wire. Furthermore, the energy reading of the reference metering devices corresponds to a count of pulses, each pulse corresponding to a predetermined amount of accumulated energy, and the metered energy reading corresponds to energy measurements of the current transformer accumulated in the metering device.

Other objects, features, and advantages of the present invention will become apparent upon consideration of the following detailed description and the accompanying drawings, in which like reference designations represent like features throughout the figures.

DETAILED DESCRIPTION OF THE INVENTION

Power distribution cabinets, or boxes, near the end of electricity distribution networks supply customers, such as homes and businesses, with electricity through electrical wires. It should be noted that the term, customer, refers to an entity which receives electricity from the power distribution cabinet. A power distribution cabinet is connected to a number of electrical wires, each of which delivers alternating current (AC) at a voltage to a customer. The voltage of each electrical wire operates with a particular phase; conventionally a power distribution cabinet can drive an electrical wire with at least three possible different phases. A customer, such as a home in North America, typically receives two-phase AC power. A business customer might require power with three-phase AC, requiring three electrical wires from the power distribution cabinet and often a neutral return wire. Of course, two-phase AC power requires at least two electrical wires and a neutral return wire from the power distribution cabinet.

Heretofore, as stated earlier, metering devices which measure the energy consumption of a customer have been located on or near the customer's premises, distant from the power distribution cabinet. On the other hand, the present invention provides for a metering device which is highly suitable for, and adapted to, a power distribution cabinet.

A Metering Device of the Present Invention

Figure 1:
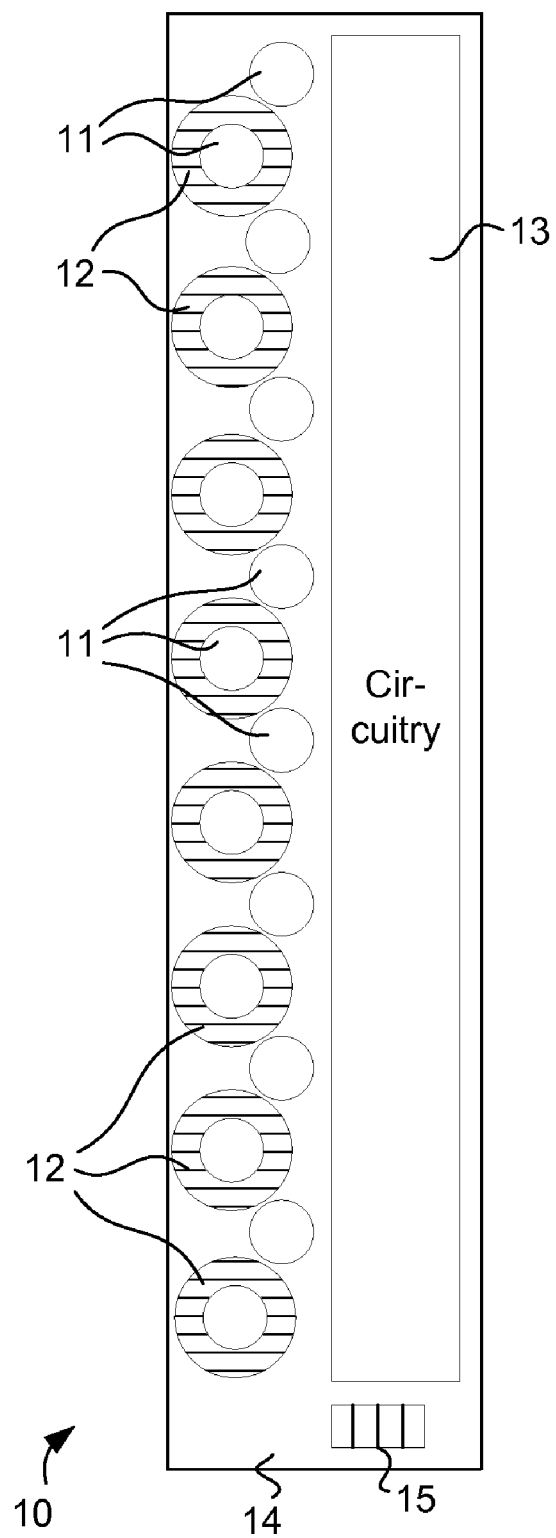
FIG. 1 is a general view of a metering device, according to one embodiment of the present invention.

In one embodiment of the present invention, a metering device 10 is implemented in a circuit board 14, as shown in FIG. 1. The board 14 has a plurality of holes 11, 16 holes in the example shown, near each other at one edge of the board 14. A current transformer 12 is mounted on the circuit board 14 around each hole 11. FIG. 1 shows that the current transformers 12 around only eight of the holes 11; the other current transformers are mounted on the opposite face of the board 14. When mounted in a power distribution cabinet, the metering device 10 receives the electrical wires to the customers through the holes 11, one wire per hole, so that the current transformer 12 can monitor the amount of electrical current being carried by the corresponding electrical wire. The board 14 also has voltage connections 15 in the form of a connector to receive voltage inputs for the three phases, termed phase A, B and C, (plus a neutral input for the neutral return wire) from the power distribution cabinet, which can be connected to drive an electrical wire with one of the A, B and C line voltages. How a power distribution cabinet is connected to make particular power distributions to its customers is beyond the purview of the present invention which is, on the other hand, directed toward measuring and metering the energy consumption of a given power distribution.

The metering device 10 receives a voltage input from each current transformer 12 responsive to the current carried by the electrical wire through the transformer 12 (and its corresponding hole 11). The current transformer and its associated burden resistor develop a current signal voltage, an analog representation of the current through the transformer input. The metering device also receives the line voltage of the electrical wire from one of the three possible voltage inputs at phases A, B, and C through the connections 15. The instantaneous product of the current and line voltage of an electrical wire is, of course, the instantaneous power being delivered by the wire at that time and the energy consumed is the amount of delivered power over time. To measure the power of electrical wires from the power distribution cabinet and meter the energy being delivered to the customers, the circuit board 14, and its current transformers 12 are physically arranged to correspond to the power outputs in a standard power distribution cabinet. The integration of current transformers 12 into the metering device 10 in a particular pattern simplifies installation of metering, reduces time for installation to a fraction of what is customary, and reduces the possibility of error in the installation.

Figure 2:
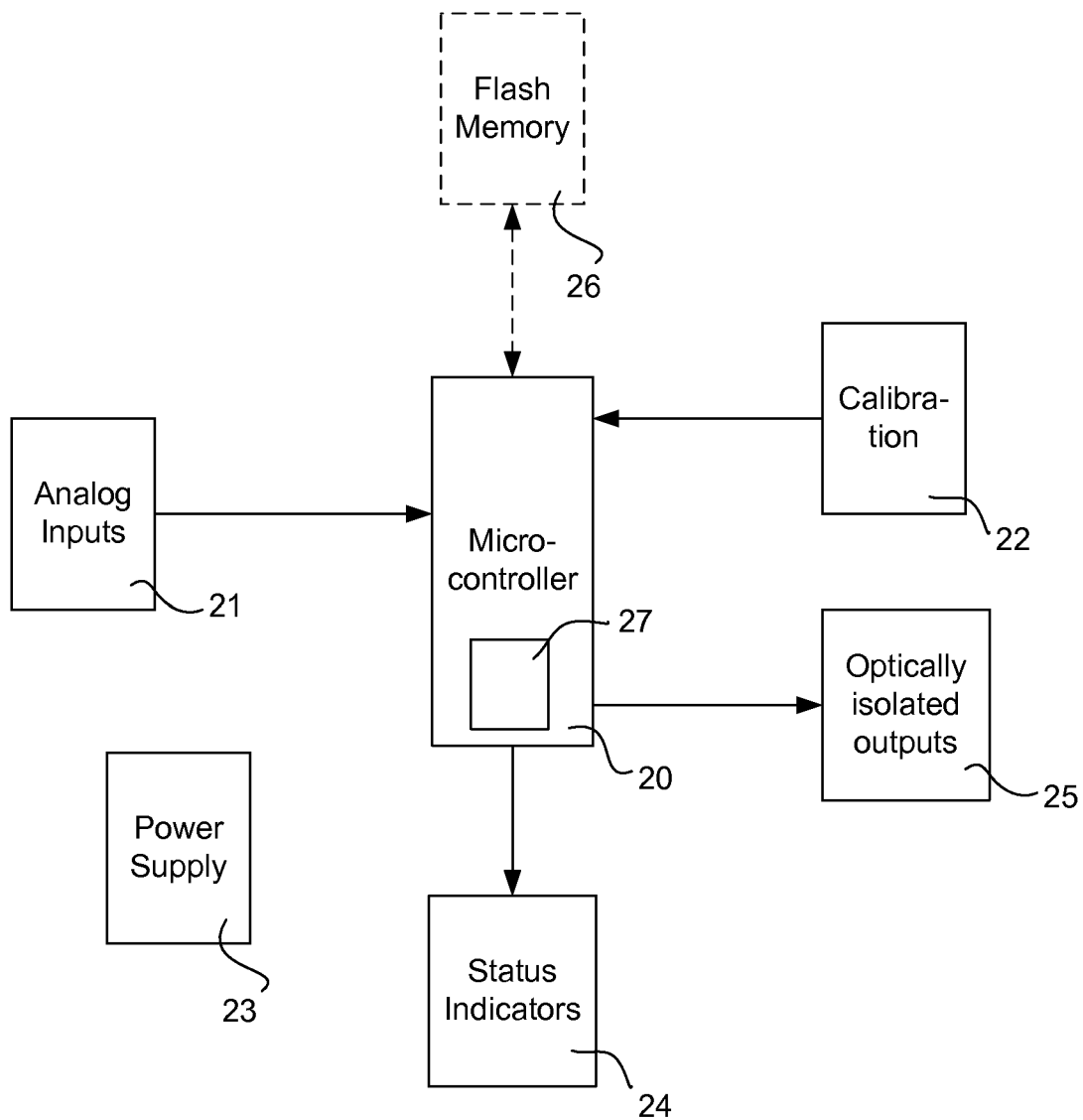
FIG. 2 shows a block diagram of the circuitry of the FIG. 1 metering device.

To process the information from the current transformers 12 and the voltage connections 15, the metering device 10 has circuitry 13. FIG. 2 is a block diagram of the circuitry 13 of the meter board 10, according to one embodiment of the present invention. At the center of the circuitry 13 is a microcontroller 20 which is connected to an analog inputs block 21, a calibration block 22, a status indicator block 24, and an optically isolated outputs block 25. A power supply 23 provides the power to operate the other parts of the circuitry 13.

Figure 3:
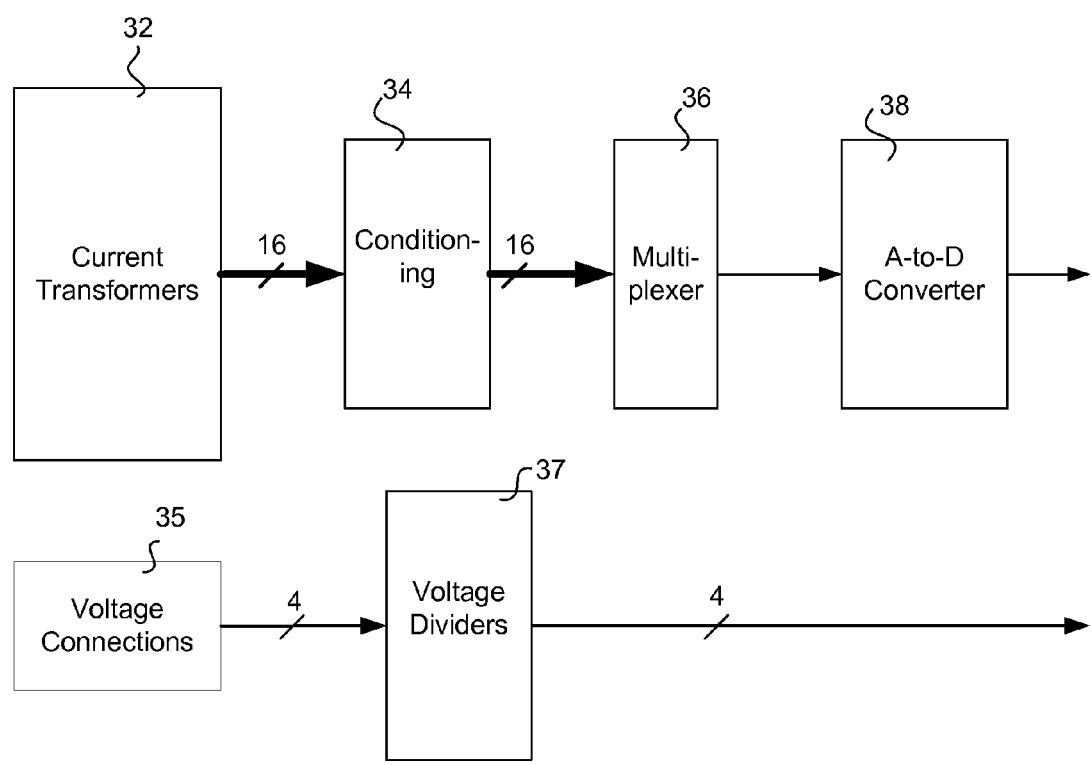
FIG. 3 shows the details of the analog inputs block of the FIG. 2 circuitry.

The 16-bit microcontroller 20 includes an internal 12-bit A/D (analog-to-digital) converter and a multiplexer, for handling line voltage signals from the analog inputs block 21, which is illustrated by block diagrams in FIG. 3, and a memory for storing information. The microcontroller memory is programmed to direct the operation of the metering device 10. Alternatively, a microprocessor can be used in place of the microcontroller with substitutes for the internal A/D converter and the large capacity memory found in a microcontroller. An example of a substitute memory can be a flash memory illustrated by the dotted box 26.

The analog inputs block 21 represents the circuits to the current transformers 12 and voltage connections 15 and is described below in greater detail. The calibration block 22 is an interface for parallel signals for the automatic calibration of the metering device 10, described below. The block 22 has 10 single-bit digital ports configured as inputs from a reference calibration metering device during the process for calibrating the subject metering device 10.

The status indicator block 24 represents lights, LEDs (Light-Emitting Diodes) in this embodiment, which are lit according to the metering device status or state of operations. Instances of the lighting of the block 24 are described below.

The optically isolated outputs block 25 includes an output interface for signals from the metering device 10, specifically, the microcontroller 20. The outputs block 25 has 16 individual ports, each of which drives an optical isolator. The final output may be as many as 16 open-collector drivers from the optical isolators. Optics provides an effective means for providing electrical isolation between the output interface and rest of the metering device 10, which is referenced to the neutral voltage of the neutral return wire for voltage measurement, while the output signals are referenced to ground or some other reference distinct from the neutral voltage.

A flash memory 27 in the microcontroller 20 stores configuration mappings of current-to-voltage, i.e., what line voltage from the connections 15 is driving the current through a current transformer 12, and of current-to-meter account, i.e., what account (customer) is to be assigned the power, and energy, consumption of a particular current through a current transformer 12. For a customer using three-phase power, at least three currents with three different line voltages, must be assigned to that meter account, for example. The configuration mappings are changed to correspond to changes in the physical connections of the power distribution cabinet to its customers. The flash memory 27 also stores calibration numbers which are used to correct the values read by the device 10.

Finally, the power supply 23 is designed to remain unaffected by changes in the power supply input voltage.

FIG. 3 is a more detailed view, though still in block form, of the analog inputs block 21. The block 32 in FIG. 3 represents the totality of the current transformers 12. The block 32 is connected to a signal conditioning block 34 which is connected to 16 input terminals of a multiplexer 36 whose single output terminal is connected to a 16-bit A/D converter 38. There is a serial data communication link between converter 38 and the microcontroller 20. The voltage connections 15 represented by the block 35 are connected by 4 lines, 3 line voltages with phases A, B and C, and the neutral line voltage, to four terminals of the microcontroller 20, though a voltage divider block 37. The four terminals of the microcontroller 20 are the input terminals to the multiplexer internal to the microcontroller 20, described above. The multiplexer selects the input to the internal 12-bit A/D converter. The voltages on the lines, though, are divided by the block 37 to a level appropriate to the input characteristics of the internal 12-bit A/D converter to maximize the resolution of the converter.

Figure 4A:
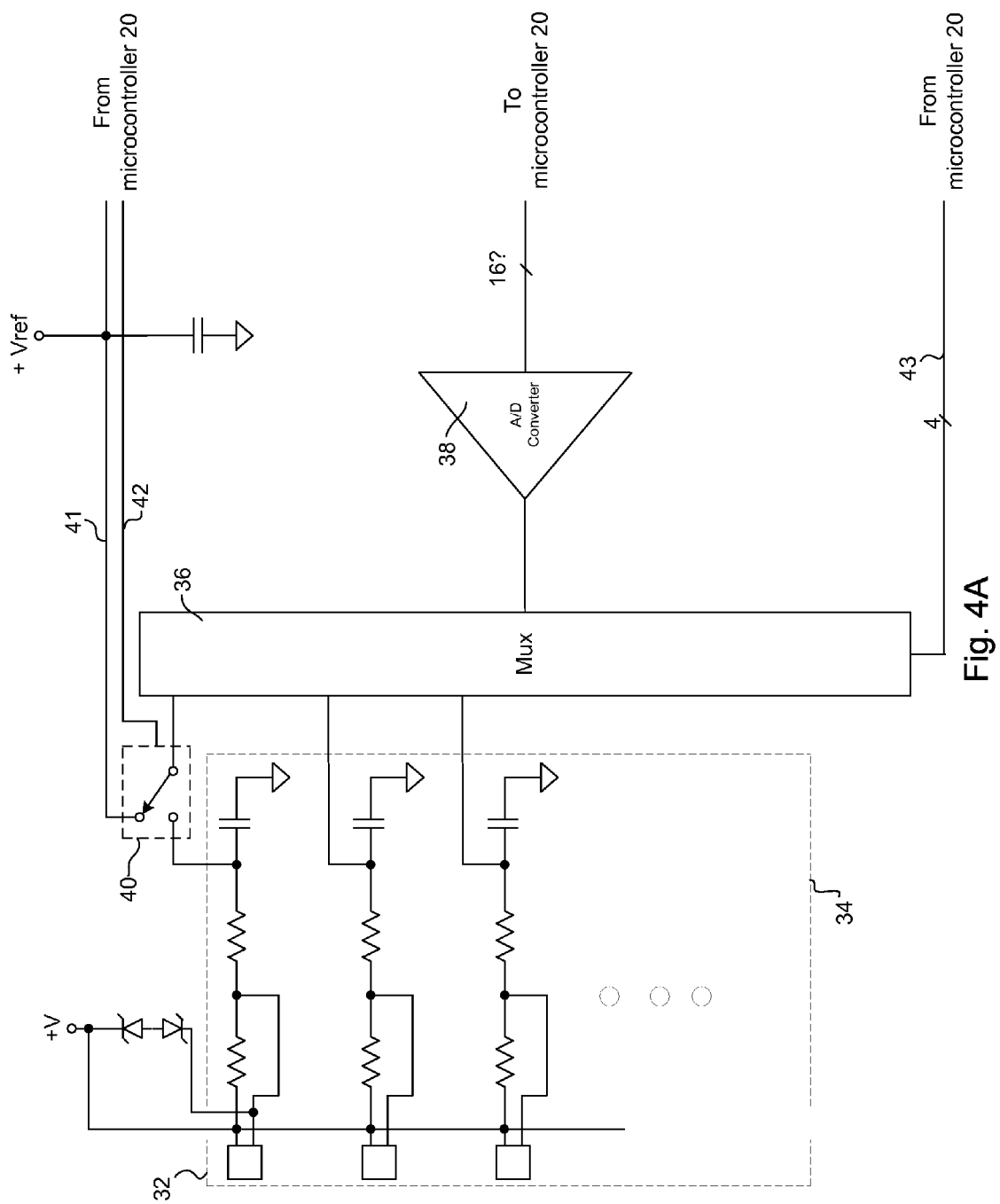
FIG. 4A details the circuits for the current transformers of the FIG. 3 analog inputs block.

The current transformers 12 represented by the block 32, and their associated burden resistors represented by the conditioning block 34, generate voltage analogs responsive to the currents. These analog signals are conveyed through passive low-pass filters to the input terminals of the multiplexer 36 as shown in FIG. 4A. Of interest is a reference current signal voltage circuit for obtaining a current signal voltage value corresponding to a zero current through a current transformer 12. This establishes an accurate zero level for current measurement. In FIG. 4A, the reference current signal voltage circuit is connected to the top current transformer 12 by an electronic SPDT (Single Pole, Double Throw) switch 40 which is controlled by a signal on a control line 42 from the microcontroller 20. The microcontroller 20 also selects the operation of the multiplexer 36 by control lines 43. In ordinary operation, the switch 40 connects the voltage analog from the current transformer to an input terminal of the multiplexer 38, as for the other 15 current transformer inputs to the multiplexer 36. For the reference current signal voltage, the switch 40 connects a zero reference voltage on the line 41 to the multiplexer 36.

Figure 4B:
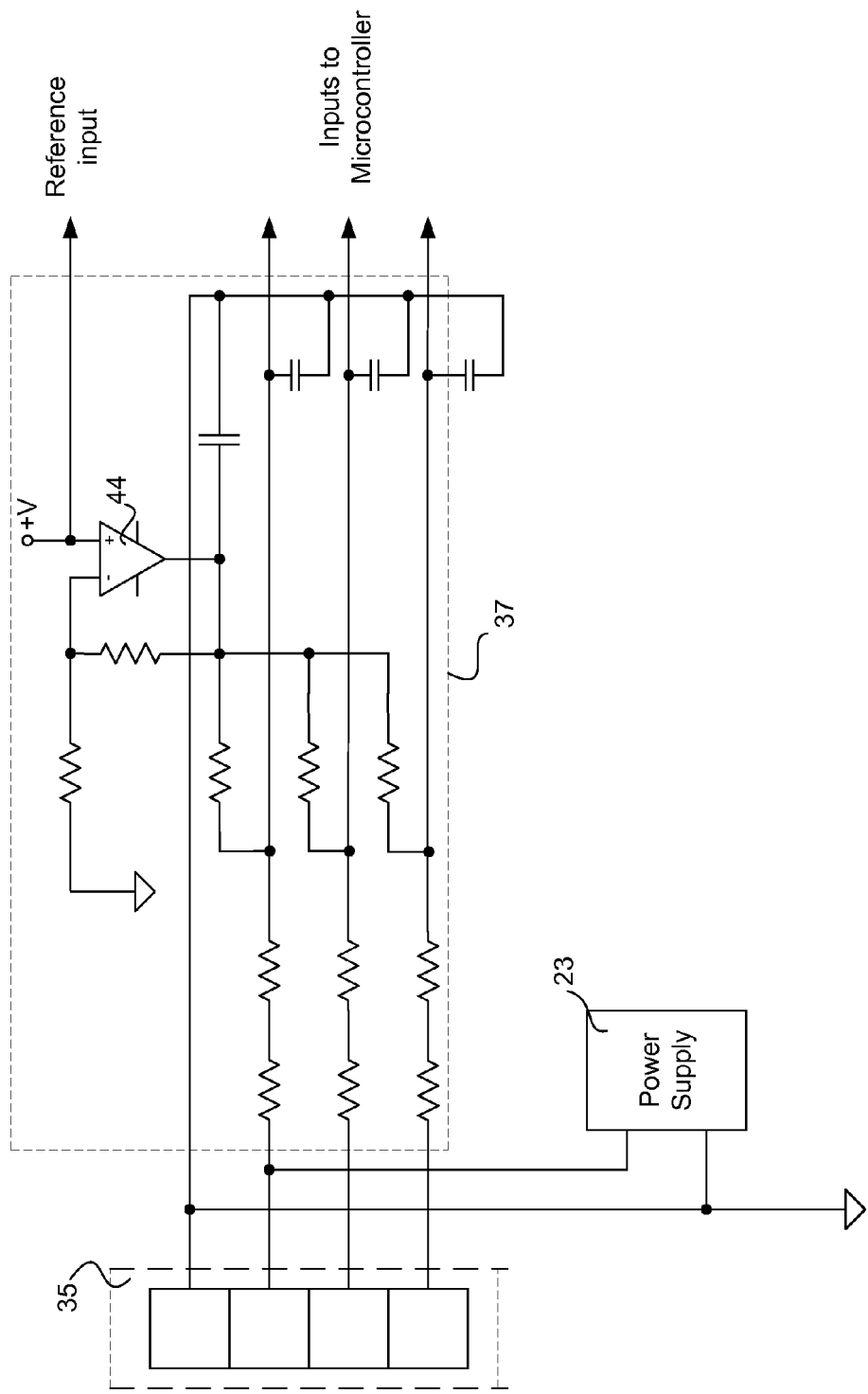
FIG. 4B details the circuits for the line voltages of the FIG. 3 analog inputs block.

As shown in FIG. 4B, each of the voltages on the voltage connections 15 is reduced by the voltage divider block 37. The lower leg of the divider circuits in the block 37 is terminated at a voltage slightly above the midscale value of the range for the internal A/D converter. When there is zero input voltage, the voltage at the output of the voltage divider is half scale voltage for the A/D converter internal to the microcontroller 20. In this embodiment converter has 12 bits; half scale is 2048 counts. The lower leg of these dividers is shunted by a capacitor which creates a low-pass filter with a time constant identical to that of the current inputs. The filtered voltage is applied directly to the internal multiplexer inputs for the internal A/D converter. FIG. 4B also illustrates a reference line voltage corresponding to zero voltage to establish an accurate zero level for the line voltage. Like the three line voltage connections for the different phases, the reference line voltage is connected to the microcontroller 20 and is shown as the top input in FIG. 4B Description of Metering Device Operations In the operation of the metering device 10, the microcontroller 20 following an ISR (Interrupt Service Routine) measures the power delivered on each of the electrical wires to the customers and meters the energy consumed by the customers. The ISR is called by a counter timer internal to the microcontroller 20, which sets the ISR period. When the ISR is called, all the currents of the electrical wires (through their current transformers 12) and their line voltages to be measured are sampled. Up to 16 currents may be sampled along with the line voltage(s) of one phase on the electrical wire(s) through one of the voltage connections 15 during the ISR call.

Sampling of an electrical wire current is performed by the A/D conversion of the voltage input from the corresponding current transformer 12 and sampling of the line voltage on the electrical wire is performed by the A/D conversion of the voltage through one of the voltage connections 15. The external A/D converter 38 converts the current signal input and the A/D converter internal to the microcontroller 20 converts the line voltage. Conversion is performed simultaneously. Simultaneous conversion for the voltage and current values of an electrical wire maintains high accuracy measurement of phase angle between voltage and current. As an example of the importance of high phase accuracy, a 15 microsecond phase error causes an error equal to 1% of reading at 60 Hz and a power factor of 0.5. The metering device 10 avoids such phase errors.

Besides the above-described current-voltage samplings to measure the power over a selected electrical wire, the ISR process also includes measuring the reference current signal voltage and a reference line voltage before the actual measurement samplings are performed. Simultaneous A/D conversions are also performed for these reference values to establish an accurate zero level for voltage and current measurements. The reference voltage measurements are averaged over a period of time, and that average, for each of voltage and current, is subtracted from the voltage and current measurements.

The metering device 10 meters the energy usage by the customers. The product of the current-voltage samplings measures the power over a selected electrical wire. The product may be positive or negative. This product is scaled to a smaller value with well-known techniques to preserve resolution and avoid any cumulative errors, and the scaled down power product is multiplied by a calibration number described later to obtain its true value. The scaled and calibrated products are then accumulated to obtain a running total of energy consumption. In effect, the accumulator integrates sampled power measurements to obtain energy. Each accumulator represents a meter account for a customer and integrates from 1-3 current-voltage products. A customer receiving three-phase power from the power distribution cabinet, for example, is connected to four electrical wires, each with a line voltage at a different phase plus neutral, so that the accumulator associated with the customer must receive the current-voltage products of three electrical wires. Each meter account, in fact, may receive more than three current-voltage products elements, but as a matter of normal practice, a maximum of three is assigned in the described metering device 10.

The energy usage tallied by each accumulator for a meter account/customer is communicated from the metering device 10 through the outputs block 25. When an accumulator reaches or exceeds a threshold value, equal to 5 WH (Watthours) in this example, the threshold value is subtracted from the accumulator, and the output corresponding to the meter account changes its state. If it is "0," the output becomes "1," and if it is "1," it becomes "0." Thus one pulse, i.e., full duty cycle of the output signal, corresponds to 10 WH plus a remainder. The remainder is recycled because it is carried by the accumulator and forms part of the next cycle of measurement. Of course, other numerical correspondences relating to energy accumulation and output pulses are possible.

As stated earlier, a calibration number is multiplied with each current-voltage product to correct for component tolerances. Calibration numbers are generated by the metering device 10 during a calibration operation in which a source of voltage and current, a reference metering device and a calibration jig are used. The source of current is usually passed through all the current transformers 12 for a calibration current and the source of voltage is applied to all voltage inputs for a calibration voltage in the calibration jig. In the described metering device 10, the current-voltage products of up to 16 electrical wires, each passing through its associated current transformer 12, may be calibrated at one time in a single calibration period. As an aside, any number of metering devices 10 may be calibrated at the same time by supplying the same calibration voltage and current to all of the metering devices. The metering devices may be arranged in a daisy chain configuration using a single calibration jig. The reference metering device provides the accurately measured current-voltage product of the calibration jig by which the current-voltage products of the metering device(s) are calibrated.

Reference metering devices typically have a single pulse output for each 0.00001 KH. The calibration jig divides the reference metering device output for a maximum frequency under conditions of calibration to below one-half the 1SR frequency of the metering device 10. This frequency reduction makes it possible to count pulses from the reference metering device through the calibration block 22 which helps define a calibration period. Upon detection of a calibration button or switch closure, the calibration period is defined as the least time greater or equal to 10 seconds that is begun and ended by an output pulse from the reference metering device (at the divided frequency), i.e., the calibration period is marked by an integer number of reference metering device output pulses. Since the accumulated current-voltage product of an electrical wire, i.e., the energy delivered over the wire, is used for calibration, the 10-second calibration period is sufficiently long to allow an accurate measurement of the accumulated amounts of up to 16 current-voltage products for one metering device 10.

During the calibration period, the numerical output of a current-voltage product is accumulated and multiplied by an initial center-valued calibration number $N_c$, which is determined by calculation based on component values. The initial value chosen for the calibration operation is immaterial provided that it is not unreasonably large or small. If the product is perfectly calibrated, the total energy registered compared to the number of reference pulses registered is a ratio R. Of course, if calibration is not perfect, a different ratio R' is obtained. The default calibration number $N_c$ is now replaced by a new calibration number $N_c'=N_c \cdot (R/R')$ to correctly calibrate the current-voltage product in future accumulations. The new calibration number $N_c'$ is stored in the non-volatile memory 27.

In the described metering device 10, there are 16 current transformers 12 and 3 phase (phases A, B and C) voltages to create 48 possible current-voltage products. Every product pair is calibrated in an automatic routine. Alternatively, the metering device 10 can calibrate just the current-voltage products to be used in the configuration chosen. So those current transformers 12 configured, or to be configured, to receive electrical wires driven by phase A line voltage are calibrated in one calibration period; the current transformers 12 configured, or to be configured, to receive electrical wires driven by phase B line voltage are calibrated in another calibration period; and the current transformers 12 configured, or to be configured, to receive electrical wires driven by phase C line voltage are calibrated in a third calibration period. Another possibility is to calibrate all the current transformers 12 configured, or to be configured, with their particular phase line voltages in one calibration period.

The configuration of the metering device 10 maps each current transformer 12 with a line voltage, and each current transformer with a meter account, i.e., customer. The configuration is chosen with the calibration operation. In the described metering device 10, 8 possible configurations are embedded in the software, and the particular configuration is selected during the calibration process and stored in the non-volatile memory 27. This allows configuration of the metering device 10 to be reprogrammable. Of course, many more configurations are possible and the particular number of 8 possible configurations should not be considered a limitation. The software can also be modified to define these correspondences in a more general way.

If the calibration operation calibrated all of the voltage-current products, configuration can made later, even in the field during installation of the metering device. However, calibration of all possible current-voltage products must be checked in order to certify the metering device; 48 current-voltage products must be checked. In the case of limited configurations in the previous paragraph, only the current-voltage products actually used need to be checked. Up to 16 current-voltage products are sufficient for checking. On the calibration jig the desired configuration from the 8 possible configurations may be chosen with a jumper wire.

Operation Details of the Metering Device

One example of the detailed operation of the metering device 10 is shown by the flow charts of the main software program, FIGS. 5A-5D, and the ISR (Interrupt Service Routine), FIGS. 6A-6D, run by the microcontroller 20. The main program is initiated by a reset step 81 of the microcontroller 20 at power up of the metering device 10. Certain housekeeping functions are performed, such as the setting up of ports for their intended functions, part of the configuring step 82. Next, in steps 83 and 84 two configuration mappings are read from the non-volatile flash memory 27. See FIG. 2. These mappings make the correspondences of current input to line voltage, i.e., the electrical wire current measured by a current transformer 12 to the particular voltage connection 15 (see FIG. 1); and the correspondence of the current input to a particular meter account. The original mappings are written at the factory during the calibration process.

The timer for the ISR (Interrupt Service Routine) is set in step 85 to call the ISR at the prescribed intervals. Step 86 flashes the software version number on an LED tart of the status indicator block 24) of the metering device 10. This involves an interaction with the ISR, and its manner of implementation is not pertinent to the present description.

At this point, the program branches depending on the calibration state, which is an index for keeping track of the particular state of calibration and can vary from 0-4. Calibration state 0 indicates that metering device 10 is not being calibrated and the device is in ordinary operation. Calibration state 1 indicates the beginning of the calibration operation, which is entered when one of the three phase calibration buttons is pushed. When the output pulse from the reference metering device used in calibration is high, the calibration state advances to 2. Ensuring that the reference metering device pulse is high is the function of calibration state 1. In calibration state 2 energy accumulation and an energy pulse counter are both set to zero to establish a baseline condition for metering during the calibration process. When the output pulse of the reference metering device is next low, the calibration state advances to 3. Hence the calibration states 1 and 2 partly function to assure that the reference metering device completes a pulse cycle as the calibration state 3 begins. In calibration state 3, pulses from the reference metering device are counted and the energy from the voltage-current pairs of the subject metering device 10 being calibrated is accumulated. The accumulation is in the form of a pulse count and a remainder. When at least 10 seconds has passed and an integer number of pulses from the reference metering device have arrived, the calibration state advances to 4. In calibration state 4 the data collected in calibration state 3 is used to calculate the calibration numbers for each voltage-current pair being calibrated. Thereafter, the calibration state returns to 0 and the normal functioning of the metering device 10 is resumed.

With the assumption that the calibration state is equal to 0 so that the process passes through test step 87, the calibration values associated with each current input (and its associated voltage phase) are inspected in step 88. If all the values for a particular voltage are reasonable, i.e., close to their expected values, a light on the circuit board 14 is lit corresponding to that phase by step 89 in FIG. 5B. A choice of the particular mapping of current-to-voltage phase, and current-to-meter account is indicated by blinking the light in a particular pattern. These blinking lights are a convenience to the technician and need not be of further concern.

Figure 5A:
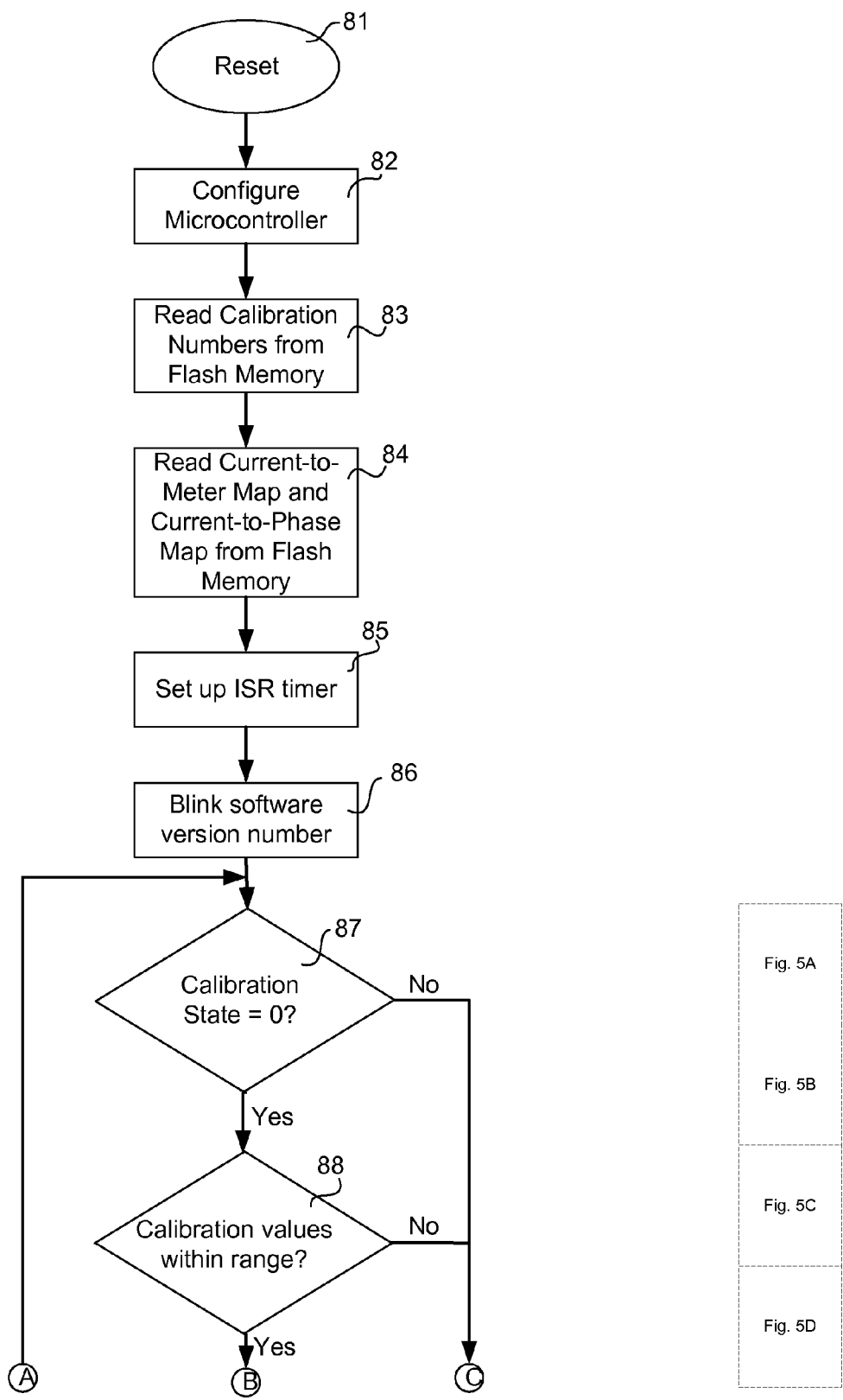
FIGS. 5A-5D are flow charts of operation of the main program of the microcontroller and circuitry, according to one embodiment of the present invention.
Figure 5B:
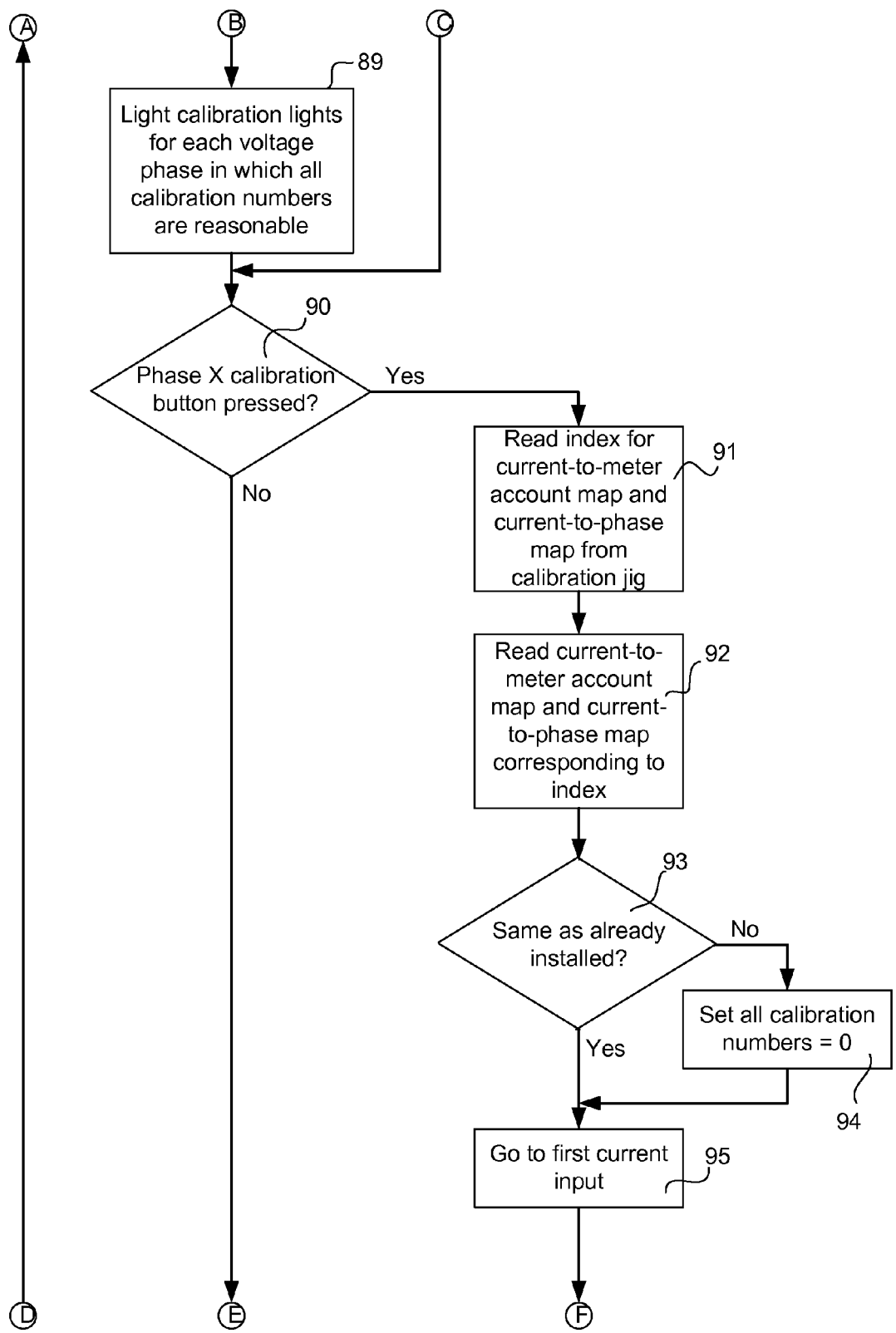
Figure 5C:
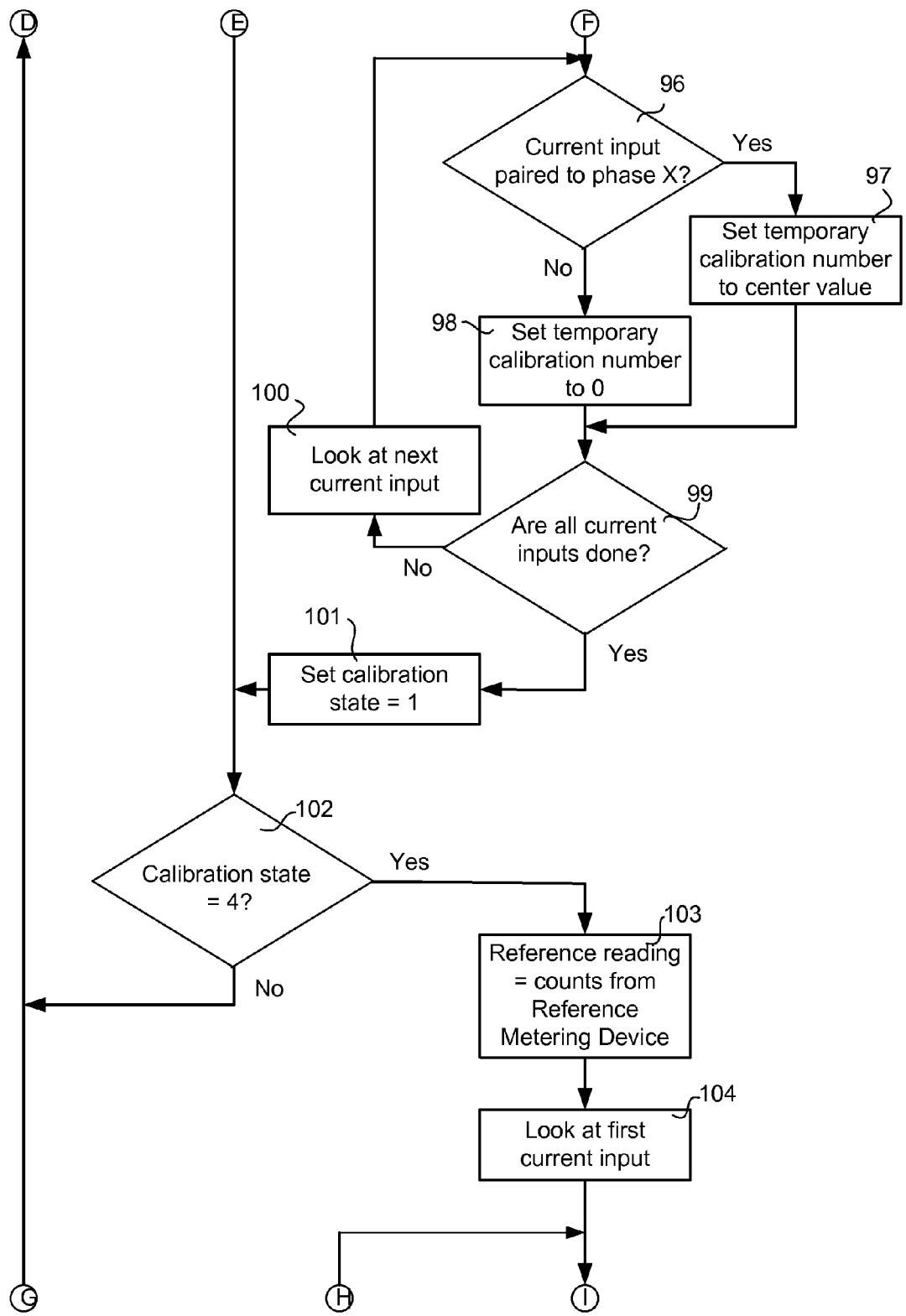
Figure 5D:
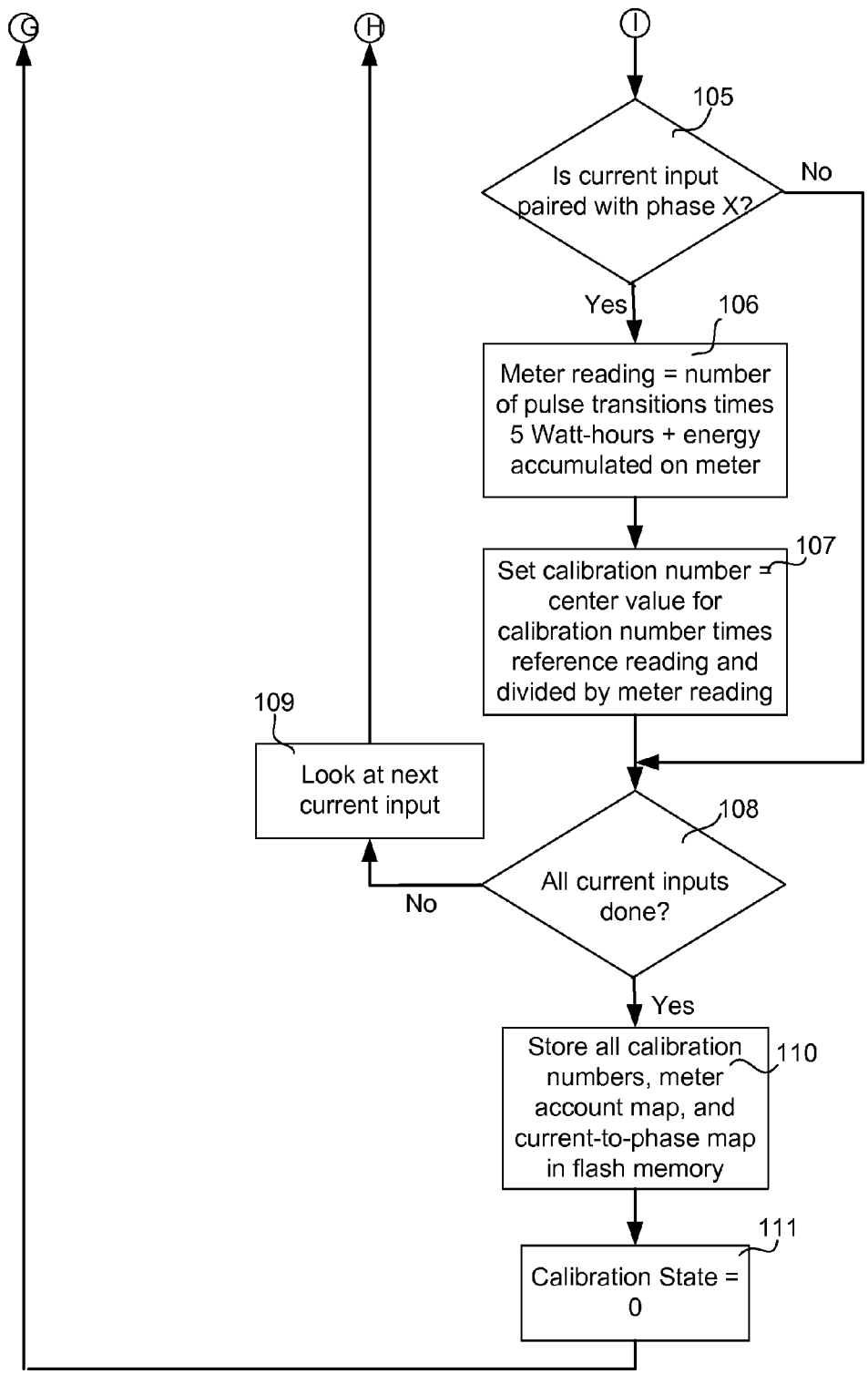

Next, assuming that the button for calibrating one phase of the voltages (A, B or C) is not pushed, the program passes through test step 90 to test step 102 n FIG. 5C. If the calibration statee is not 4, the program flow loops back to the point just after blinking the software version number, step 86 in FIG. 5A. A description of the branch at test step 102 where the calibration state is 4 is found in the description below on calibration.

The measuring and metering of the current input from the current transformers 12 and the different line voltages from the voltage connections 15 are handled by the ISR (Interrupt Service Routine). The ISR is called by a periodic signal derived from the clock of the microcontroller 20. The main program flow is interrupted and the ISR is run with start step 50 in FIG. 6A. While the basic metering operations reside within the ISR, certain necessary ancillary processes lie outside it and the process returns to the main program after each run of the ISR.

Figure 6A:
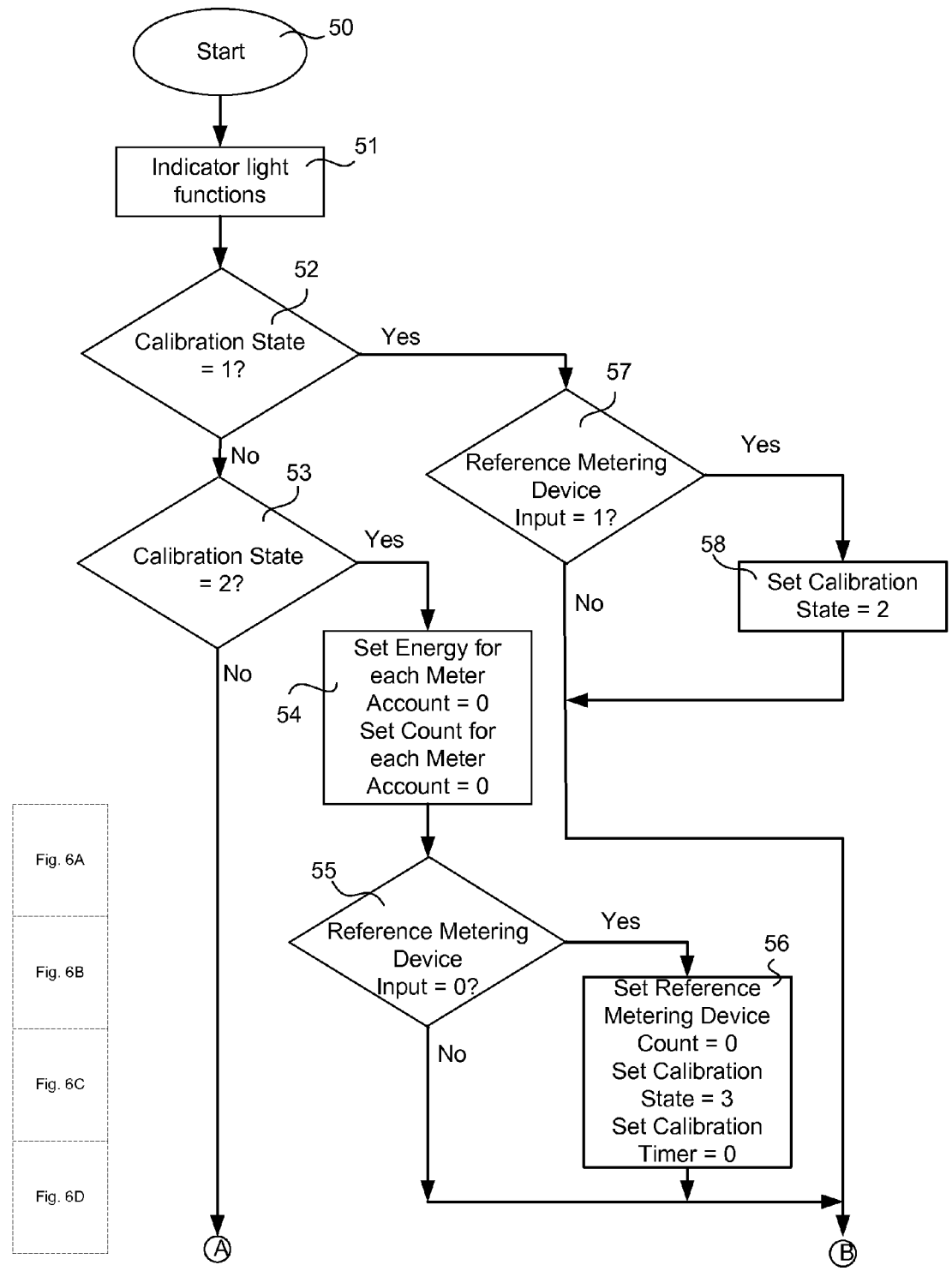
FIGS. 6A-6D are flow charts of an interrupt service routine to the main program of FIG. 5A-5D.

As illustrated by step 51 in FIG. 6A, indicator lights are first controlled to flash in a timed fashion. The function of these lights is for technician convenience and is not relevant to meter operation, so their operation is not described any further.

Next, the program process moves to a series of three conditional statements, steps 52, 53, and 59 (in FIG. 6B), which test for calibration states 1, 2 and 3 respectively. Assuming calibration state=0, i.e., the metering device 10 is not being calibrated, the process flow proceeds to the metering operation itself As described earlier for an embodiment of the metering device 10, 16 current inputs are derived from the 16 current transformers 12. A software loop is initiated that handles each of the current inputs. A typical loop for the nth current input is described as an example. The other 15 loops operate in an identical fashion. One of 16 current inputs is selected by the external multiplexer 34, and one of three line voltages of the voltage connections 15 is selected by the internal multiplexer of the microcontroller 20. The external multiplexer 34 has one input that is further multiplexed between an input current and a reference level neutral to current measurement. Likewise, the internal multiplexer has a fourth input connected to a reference voltage neutral to the voltage inputs.

For each iteration of the loop, the reference current and the reference voltage are converted for the nth current input by the external 16-bit A/D converter 36 and the internal A/D converter by step 65. Subsequently by step 66, the two A/D converters convert the nth current input and the voltage phase input that is paired to this current. This pairing is described in greater detail below. As described above, the two conversions by the external 16-bit A/D converter 36 and the internal A/D converter are performed simultaneously and is possible because of the availability of two A/D converters, one for current and one for voltage. A baseline level corresponding to the zero or neutral level for voltage and current is subtracted from the current reading and the voltage reading by step 67 in FIG. 6C. Each of these baselines is derived from the conversion of the above-described reference neutral levels. In this particular embodiment, an average of several reference level readings is used to establish each baseline.

The product of $n^{th}$ current and its line voltage is computed by step 68. This product may be considered to represent the energy flow in a period of time of length l/f, where f is the frequency of sampling set by the ISR timer (step 85 of FIG. 5A). The product may be positive or negative. For convenience and computational efficiency, the magnitude of this number is reduced by a fixed factor and it is multiplied by the calibration number that is associated with the particular current input and voltage phase in step 69.

The metering of electric power includes the accumulation of energy flow of one, two, or three current-voltage products, in the case of single, two, or three-phase metering respectively, depending upon the configuration mapping of current-voltage pairs to particular meter accounts. It should be appreciated that each current-voltage product is assigned to one and only one meter account, but each meter account may have more than one voltage current product assigned to it. By step 70 the scaled and calibrated product is added to an accumulating register for the particular meter account. An output signal for that meter account is sent whenever a certain quantity of energy, expressed in Watt-hours, is accumulated in the meter account register.

In the present embodiment of the present invention, one complete pulse for the output signal represents 10 Watt-hours. Of course, other quantities can be used for one complete pulse. After the addition of the energy product to the meter account variable according to step 70, step 71 tests whether the variable now exceeds 5 Watt-hours (or 50% of the energy level represented by one complete pulse). If so, an output port representing the particular meter account changes state by step 72. If the port output is high, it is made to go low; if its output is low, it is made to go high. At the same time by step 73, the quantity corresponding to 5 Watt-hours is subtracted from the meter account variable. That is, each time 5 watt-hours is accumulated, a half pulse is sent from the metering device 10 and 5 Watt-hours is subtracted from the meter account register in the device 10. In this manner, information about the energy for a particular meter account accumulated internally by the metering device 10 is transferred to some external accumulator in 5 Watt-hour increments, or 10 Watt-hours per complete pulse.

There is a possibility of negative energy accumulation. This particular embodiment does not register net negative energy accumulation in the long term. If less than −0.161 Watt-hours is accumulated by test step 74 (in FIG. 6D), step 75 resets the internal energy register to −0.161 Watt-hours. A small accumulation of negative energy is necessary. When energy is consumed with a power factor less than one, the accumulated energy may dip slightly negative under the condition that the accumulated energy is set to near zero by subtraction of 5 Watt-hours, and there is phase difference between current and voltage.

Returning to the program flow, test step 78 checks whether every current input has been serviced and if not, step 79 moves the process to the next current input and the program process loops back to the A/D conversions of steps 65 and 66 to service the next current input and its associated voltage phase. If all current inputs have been serviced, the ISR ends at step 80 and the program flow returns to the main program.

As described above, for the calibration of the metering device 10, the calibration jig which receives the metering device 10 provides a single current through all the current transformers 12 (and holes 11), and single voltage for all three voltage connections for phase A, phase B, and phase C. The accurate reference metering device which is connected to the same current and voltage outputs a stream of pulses with high resolution. For example, the reference metering device may output 1 pulse per each 0.00001 Watt-hour. The pulse train from the reference meter is divided down by a counter in order to insure that the maximum divided frequency is less than half the frequency of the ISR. This allows the reference metering device output to be read unambiguously within the ISR process.

A positive response to the test step 90 in the Main Program in FIG. 5B, which checks whether a Phase X button, part of the calibration block 22 shown in FIG. 2, on the metering device 10 has been pressed, can be considered the start of the calibration operations. X represents the line voltage phase A, B, or C, each of which is calibrated separately in this embodiment. If the Phase X calibration button is pressed, by step 91 an index for the particular mapping of current-to-phase, and current-to-meter account is read at a parallel port of the metering device 10 from the calibration jig. In this embodiment, the index is read directly as a binary number. At this point, the desired mapping becomes available by step 92 to the program in the form of an array that is addressed by the index and by the current input. One array yields the associated voltage phase, and the other array yields the associated meter account. Step 93 tests whether the mapping is the same as one already stored in the nonvolatile memory 27. If not, step 94 sets all the calibration numbers $N_c$ to 0. Otherwise, they are left as they are. The calibration numbers are applied to input current-line voltage products to correct these values, as determined by the reference metering device. Steps 93 and 94 ensure the removal of a calibration number that was based on another calibration but preserve a calibration number based on a current configuration chosen.

The main program now begins a loop through all 16 of the current inputs, starting with the first current input, step 95. If the current input is paired to phase X where X=A, B, or C, (corresponding to the button pushed) by test step 96 (in FIG. 5C), a temporary calibration number is set to a center value by step 97. If not, step 98 sets the calibration number to zero. This causes each meter account to register only energy use from that particular line voltage. In each meter account there is at most one current input associated with each line voltage. Thus that particular current input is temporarily the only input to the meter account. When this process has been followed for all the current inputs by test step 99 and loop step 100, the calibration state is set to 1 by step 101.

It should be noted in passing that temporarily setting calibration numbers to zero for phases other than phase X is only one example of the present invention. In a different embodiment of the invention, independent registers for each voltage-current pair may be defined during calibration and all 16 voltage-current pairs calibrated in a single run of the calibration routines.

With calibration state=1, upon a call to the ISR by the ISR timer, the test step 52 in FIG. 6A, just beneath the indicator light functions, makes a branch to step 57, which checks for a high input from the above-described reference metering device. If so, step 58 advances the calibration state to 2. At test step 53 in FIG. 6A, there is another conditional branch in the ISR for calibration state=2 that is reached only if the calibration state is not equal to 1. Step 54 sets the energy accumulation for each meter account to zero and also sets a counter for each meter account to zero in this line voltage. The counter tracks the number of output pulse transitions for each 5 WH accumulated for the meter account in calibration state 3. As already noted, 5 Wh is nominal, since in general a transition occurs when a 5 Wh threshold is exceeded. This uncertainty is eliminated in the final calibration calculation, as described below. Next, test step 55 checks for an input of zero from the reference metering device. If yes, step 56 sets a counter associated with the reference metering device to zero, sets a calibration timer to zero, and sets the calibration state to 3. The counter associated with the reference metering device tracks the number of pulses generated by the reference metering device and divided down by the calibration jig.

Figure 6B:
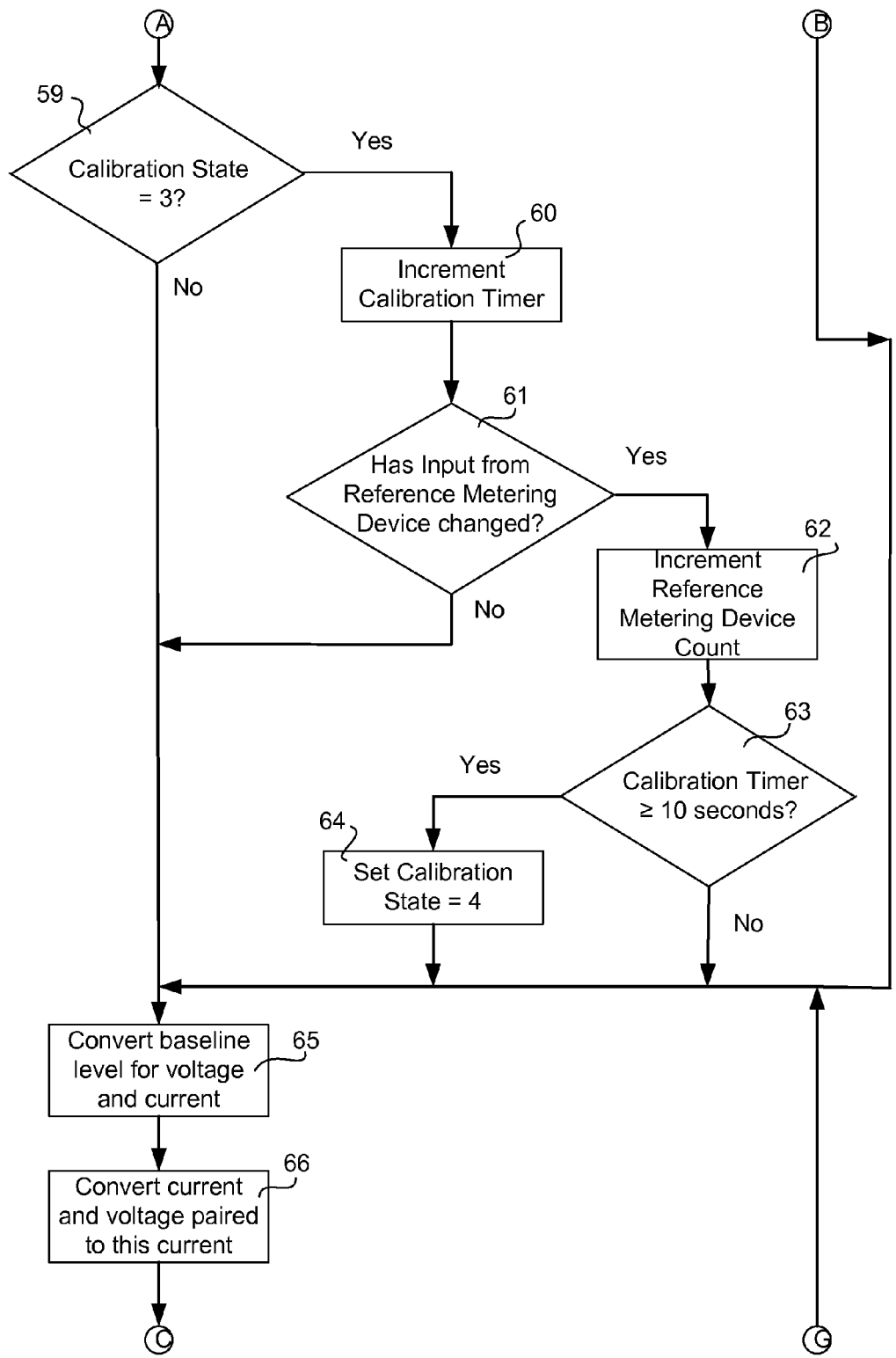
Figure 6C:
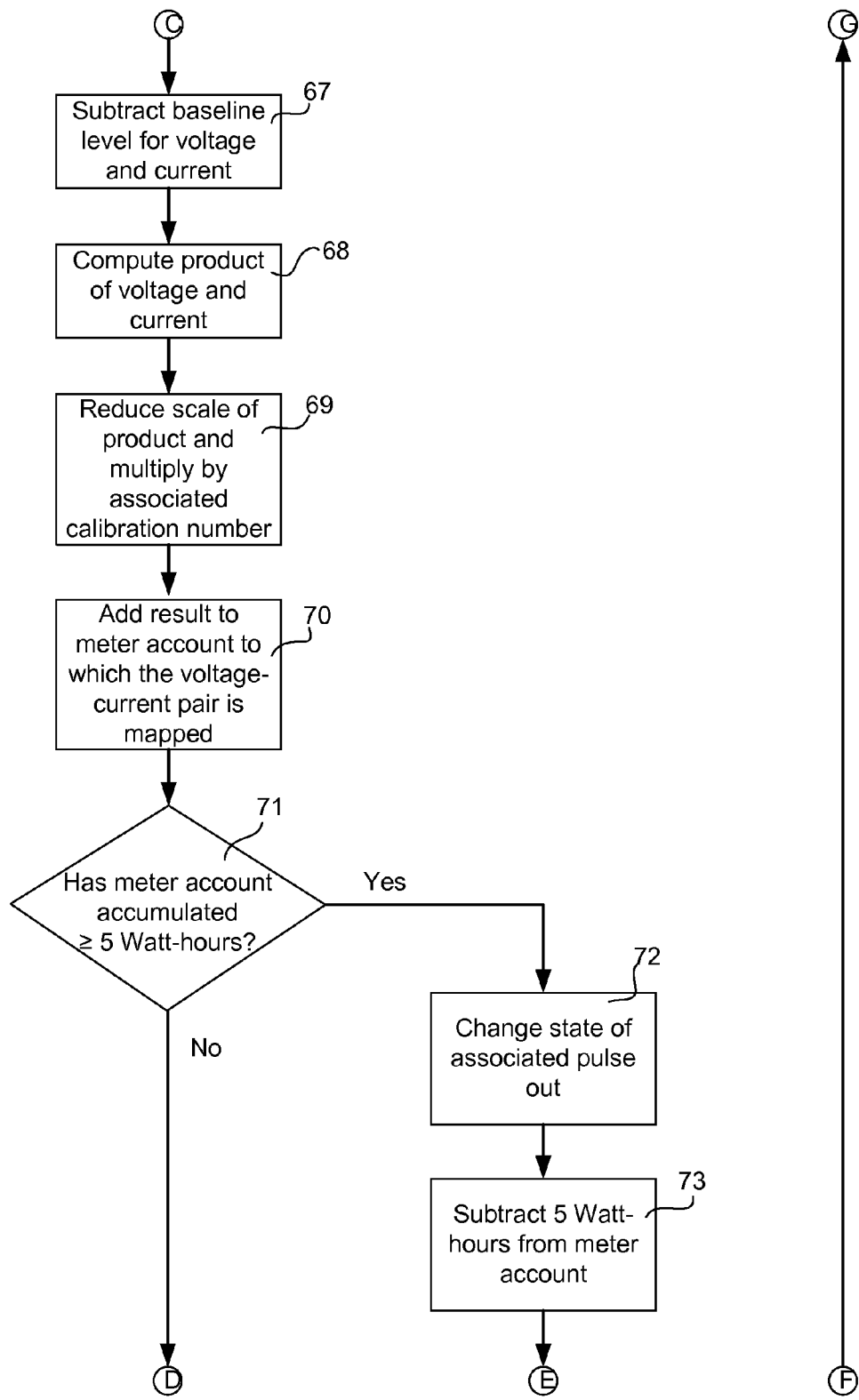
Figure 6D:
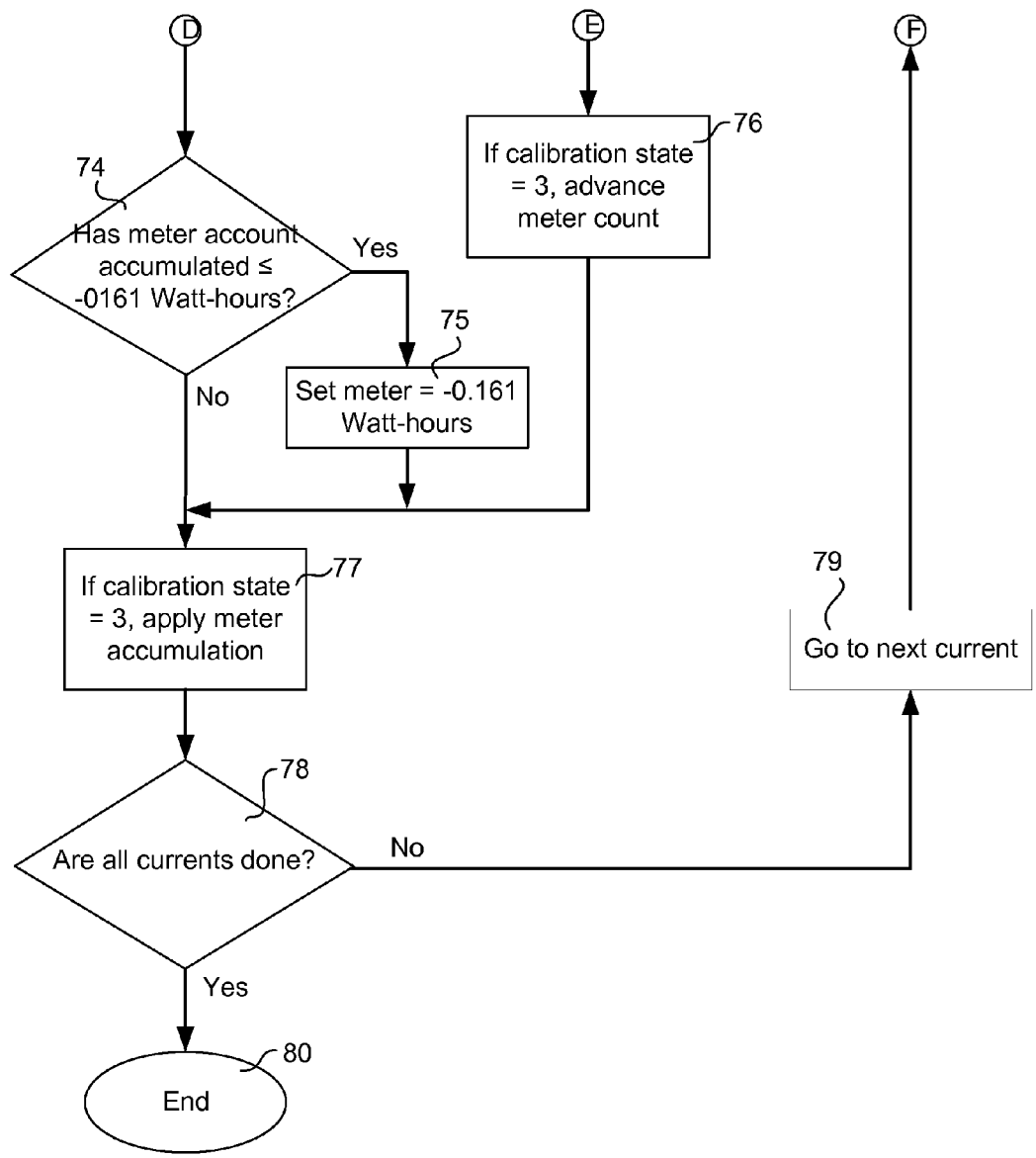

On the next loop through the ISR, the program flow passes through the conditional branches for calibration states 1 and 2 but then branches at test step 59 in FIG. 6B to a conditional branch for calibration state=3. On this conditional branch, the calibration timer is incremented by step 60 and test step 61 checks whether the input from the reference metering device has changed since the last loop. If so, the reference meter counter is incremented by step 62 and the time is checked to see if more than 10 seconds have elapsed by test step 63. If yes, the calibration state is set to 4 by step 64.

Meanwhile, as seen in steps 91, 92, 93, and 94, the metering device 10 has been operating with a new configuration, a new current-to-meter account map and a new current-to-voltage map, and with calibration values set to center value or zero, depending on whether the associated line voltage is phase X or not. If the device 10 is in calibration state 3, the counter for each meter account is advanced at each pulse transition and a copy of the value of the meter energy accumulation is made for each meter account. When the calibration state advances to 4, the total measured energy flow during a period of about 10 seconds is encoded in the pulse transition count and in the last meter energy accumulation value. The energy measured by the reference meter is encoded in the reference meter counter.

The calibration process depends on processes in the main program loop as well as in the ISR. The particular configuration of current transformer to line voltage phase, and the configuration of the energy from that pair to a particular meter account (customer) is determined in the main program loop. In order to isolate the energy measured by a particular current transformer from others that may be assigned to the same meter account (customer), the calibration numbers of all current-voltage pairs is set to zero if they are assigned to a line voltage phase different from the one being calibrated.

In particular, with reference to FIG. 5B, the index of the map that describes current to line voltage phase and current to meter (customer) is read in step 91. In this embodiment, the index is actually established by placement of a jumper block in a calibration jig. In step 92, the mappings that correspond to the index are entered into appropriate variables.

In step 93, it is checked to see if there has been a change of mapping from what has already been installed. If there has, all calibration numbers are set to zero. Step 93 is not essential to operation of the calibration process. Its purpose is to prevent confusion on the part of the calibrating technician. If there has been no change in configuration, we wish to preserve calibration numbers of phases other than the phase being calibrated, but if there has been a change, all numbers are set to zero, making it obvious that recalibration will be required.

In step 95 a loop is begun with steps 96-100 that cycles through all the current transformers. In case the transformer is mapped to the line voltage phase being calibrated, a provisional calibration number is assigned. The effect is that as the calibration process continues by recording data in the ISR, only energy from a current transformer that is paired with the line voltage phase under calibration can register energy, effectively isolating its contribution from all others associated with this meter (customer).

The role of the ISR in the calibration process is now over, and the process returns to the main program and the process of calibration when the main loop meets the conditional branch for calibration state=4, i.e., test step 102. The following step 103 loads the count values from the reference metering device counter into the metering device 10, specifically a register in the microcontroller 20. These values represent what the metering device 10 should measure for the current inputs. The process now enters a loop through all the current inputs, starting with step 104. If the current current input is paired to phase X as tested by step 105, the energy meter reading is computed as the number of pulse transitions multiplied by 5 watt-hours plus the energy remaining on the meter account register (the last energy accumulation value for this meter account) by step 106. Step 107 calculates a new calibration number $N_c'$ for this current-voltage pair. It is the center calibration number times the reference meter reading and divided by the reading by the metering device 10, i.e., $N_c'=N_c\cdot(R/R')$ described previously.

Step 108 tests whether all the current inputs have been completed; if not, the process loops back through step 109 to the next current input to test step 105. When the process has finished looping through all current inputs and cleared by step 108, step 110 stores the new calibration numbers in the flash memory 27, along with the mapping of current-to-phase and current-to-meter account. Then the calibration state is set to zero by step 111. The new calibration numbers are set and normal metering operation resumes.

The result is a highly integrated metering device which handles maximum voltages on the electrical wires to the customers from below 90 volts to 385 volts, 50-60 Hz. Currents can vary over at least a 100-to-1 range without a loss of accuracy. Calibration of the metering device is performed automatically and internally. Only 10 seconds is required with device accuracy within 0.05% or better.

Thus the metering device of the present invention is a significant advance over existing metering technologies. The unique integration of the current transformers into a single metering device with flexibly programmable configuration allows an easy and compact installation of the metering device with the virtual elimination of wiring errors. The metering device is ideally suited for placement in the power distribution cabinets already found in buildings to allow individual metering of consumers in the building without the costs and difficulties of rewiring.

Additionally, the metering device can be used to monitor the output of a distribution transformer before the output is split for the individual users. The readings of this metering device can be compared with the readings of other metering devices which are closer to the individual consumers. By doing so, an electric utility can easily detect power theft, e.g., bypassing or tampering with a meter; detect the imbalances in the power usage of the transformer outputs to guide the rearrangement of the transformer outputs for higher efficiency and better usage; and detect inefficiencies between the transformer and the billing metering devices.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A metering device for a power distribution cabinet delivering power from power outputs through electrical wires to one or more customers, said metering device comprising:
   a board having a plurality of holes, a hole for receiving at least one of said electrical wires therethrough;
   connections for different line voltages on said board;

a plurality of current transformers on said board, each current transformer arranged around one of said plurality of holes so as to generate a output signal responsive to a current of an electrical wire through said one hole, said current transformers and said holes arranged for physical correspondence to said power outputs; and circuitry on said board, said circuitry connected to said current transformers and said voltage connections for metering energy from said power outputs through said electrical wires to one or more of said customers;

whereby integration of said plurality of current transformers, said line voltage connections and said circuitry into said metering device simplifies installation, reduces installation time, and reduces the possibility of installation error of said metering device.

2. The metering device of claim 1 wherein said plurality of current transformers is mounted on two sides of said board.

3. The metering device of claim 1 wherein said circuitry comprises a first circuit sampling a current signal voltage from said output signal of a current transformer for a current through an electrical wire and a second circuit sampling a line voltage for said electrical wire, said first and second sampling circuits operating simultaneously for an accurate measurement of power through said electrical wire.

4. The metering device of claim 3 wherein said circuitry comprises a circuit generating a reference current signal voltage for a zero current through an electrical wire and a circuit generating a reference line voltage for a zero voltage on said electrical wire, said reference current generating circuit and said reference line voltage generating circuit operating with said first and second sampling circuits respectively for accurate measurements of power through said electrical wire.

5. The metering device of claim 3 wherein said first and second sampling circuits comprise first and second A/D converters respectively sampling said current signal voltage and said line voltage simultaneously.

6. The metering device of claim 5 wherein each current transformer is connectable to said first A/D converter through a first multiplexer and each line voltage connection connectable to said second A/D converter through a second multiplexer so that said first and second A/D converters respectively sample said current signal voltage and said line voltage of a selected current transformer and line voltage connection simultaneously.

7. The metering device of claim 3 wherein selection of said current transformer and line voltage connection for said simultaneous sampling is programmably mapped to one of a plurality of meter accounts monitored by said metering device.

8. The metering device of claim 7 wherein said circuitry comprises a nonvolatile memory storing mapping of at least one current transformer and line voltage connection selected for simultaneous sampling.

9. The metering device of claim 1 wherein said plurality of holes and said plurality of corresponding current transformers are sufficiently large so that said circuitry meters energy from said power outputs to at least two customers.

10. The metering device of claim 7 wherein selection of said current transformer and line voltage connection for said simultaneous sampling is programmably mapped from at least two possible mappings.

11. The metering device of claim 1 wherein said circuitry comprises a circuit generating a calibration number from an energy reading of a reference metering device and a metered energy reading of each current transformer and corresponding electrical wire mapped to one line voltage whereby said metered energy are rapidly calibrated.

12. The metering device of claim 11 wherein mapping of each current transformer and corresponding electrical wire to said one line voltage is programmable and stored in a nonvolatile memory.

13. The metering device of claim 11 wherein said circuit generates said calibration number from a ratio of an energy reading corresponding to pulse counts, each pulse corresponding to a predetermined amount of energy, from said reference metering device to an energy reading corresponding to measured energy registered in said metering device.

14. The metering device of claim 13 wherein said measured energy registered in said metering device comprises pulse counts, each pulse corresponding to a predetermined amount of energy, plus a remainder.

15. The metering device of claim 1 wherein an arrangement of said plurality of holes in said board correspond to an arrangement of said power outputs of said power distribution cabinet.

16. The metering device of claim 15 wherein said circuitry comprises a first circuit sampling a current signal voltage from said output signal of a current transformer for a current through an electrical wire and a second circuit sampling a line voltage for said electrical wire, said first and second sampling circuits operating simultaneously for an accurate measurement of power through said electrical wire.

17. The metering device of claim 16 wherein said circuitry comprises a circuit generating a reference current signal voltage for a zero current through an electrical wire and a circuit generating a reference line voltage for a zero voltage on said electrical wire, said reference current generating circuit and said reference line voltage generating circuit operating with said first and second sampling circuits respectively for accurate measurements of power through said electrical wire.

18. The metering device of claim 16 wherein said first and second sampling circuits comprise first and second A/D converters respectively sampling said current signal voltage and said line voltage simultaneously.

19. The metering device of claim 16 wherein selection of said current transformer and line voltage connection for said simultaneous sampling is programmably mapped to one of a plurality of meter accounts monitored by said metering device.

20. The metering device of claim 15 wherein said circuitry comprises a circuit generating a calibration number from an energy reading of a reference metering device and a metered energy reading of each current transformer and corresponding electrical wire mapped to one line voltage whereby said metered energy are rapidly calibrated.

21. The metering device of claim 20 wherein said circuit generates said calibration number from a ratio of an energy reading corresponding to pulse counts, each pulse corresponding to a predetermined amount of energy, from said reference metering device to an energy reading corresponding to measured energy registered in said metering device.

22. The metering device of claim 21 wherein said measured energy registered in said metering device comprises pulse counts, each pulse corresponding to a predetermined amount of energy, plus a remainder.

23. The metering device of claim 15 wherein said plurality of holes and said plurality of corresponding current transformers are sufficiently large so that said circuitry meters energy from said power outputs to at least two customers.

24. A metering device for metering energy delivered on electrical wires, said device comprising:

at least one current transformer arranged to generate a signal in response to current on an electrical wire;

at least one voltage connection for a line voltage of said electrical wire; and circuitry connected to said at least one current transformer and said at least one voltage connection sampling said current transformer signal and said line voltage to measure instantaneous energy delivery over said electrical wire, said circuitry including an electronic computing device which acquires at least one internal pair of energy accumulation numbers, one number corresponding to internal energy accumulation by the metering device from said measured instantaneous energy delivery, another number corresponding to external measurement of energy by a reference metering device, and calculates a calibration number to create substantial equivalence between said pair of energy accumulation numbers by a comparison of said two numbers;

whereby said metering device calibrates measurement of said instantaneous energy delivery over said electrical wire.

25. The metering device of claim 24 further comprising a plurality of current transformers, each current transformer arranged to generate a signal in response to current on one of a plurality of electrical wires; and wherein said circuitry is connected to each current transformer and said at least one voltage connection, said circuitry sampling said current transformer signal and said line voltage to measure instantaneous energy delivery over each one of said plurality of electrical wires, said electronic computing device acquiring a plurality of internal pairs of energy accumulation numbers, each number of a pair corresponding to internal energy accumulation by the metering device from said measured instantaneous energy delivery of one of said electrical wires, another number of said pair corresponding to external measurement of energy of one of said electrical wires by said reference metering device, and calculating a calibration number to create substantial equivalence between said pair of energy accumulation numbers by a comparison of said two numbers, whereby said metering device calibrating measurement of said instantaneous energy delivery over each one of said plurality of electrical wires in one calibration operation.

26. The metering device of claim 25 further comprising a plurality of voltage connections, each voltage connection for a line voltage with a particular phase of an electrical wire; and wherein said circuitry is connected to each current transformer and said plurality of voltage connections, said circuitry sampling said current transformer signal and said line voltage of each particular phase to measure instantaneous energy delivery over each one of said plurality of electrical wires and phase, said electronic computing device acquiring a plurality of internal pairs of energy accumulation numbers, each number of a pair corresponding to internal energy accumulation by the metering device from said measured instantaneous energy delivery of one of said electrical wires and phase, another number of said pair corresponding to external measurement of energy of one of said electrical wires and phase by said reference metering device, and calculating a calibration number to create substantial equivalence between said pair of energy accumulation numbers by a comparison of said two numbers, whereby said metering device calibrating measurement of said instantaneous energy delivery over each one of said plurality of electrical wires and phase in one calibration operation.

27. The metering device of claim 26 wherein each one of said plurality of electrical wires and phase is programmably mapped to one of a plurality of meter accounts monitored by said metering device.

28. The metering device of claim 25 further comprising a plurality of voltage connections, each voltage connection for a line voltage with a particular phase of an electrical wire; and wherein said circuitry is connected to each current transformer and said plurality of voltage connections, said circuitry sampling said current transformer signal and said line voltage of each particular phase to measure instantaneous energy delivery over a selected one of said plurality of electrical wires and phase, said electronic computing device acquiring a plurality of internal pairs of energy accumulation numbers, each number of a pair corresponding to internal energy accumulation by the metering device from said measured instantaneous energy delivery of each selected one of said electrical wires and phase, another number of said pair corresponding to external measurement of energy of each selected one of said electrical wires and phase by said reference metering device, and calculating a calibration number to create substantial equivalence between said pair of energy accumulation numbers by a comparison of said two numbers, whereby said metering device calibrating measurement of said instantaneous energy delivery over each selected one of said plurality of electrical wires and phase in one calibration operation.

29. The metering device of claim 28 wherein each selected one of said plurality of electrical wires and phase is programmably selected and mapped to one of a plurality of meter accounts monitored by said metering device.

30. The metering device of claim 28 wherein each selected one of said plurality of electrical wires and phase is programmably mapped to one of a plurality of meter accounts monitored by said metering device.

31. The metering device of claim 29 wherein selection of each one of said plurality of electrical wires and phase is programmably mapped from at least two possible mappings.

* * * * *